United States Patent
Liu et al.

(10) Patent No.: US 11,574,881 B2
(45) Date of Patent: Feb. 7, 2023

(54) SEMICONDUCTOR PACKAGE STRUCTURE WITH ANTENNA

(71) Applicant: MediaTek Inc., Hsin-Chu (TW)

(72) Inventors: Nai-Wei Liu, Hsin-Chu (TW); Yen-Yao Chi, Hsin-Chu (TW); Yeh-Chun Kao, Hsin-Chu (TW); Shih-Huang Yeh, Hsin-Chu (TW); Tzu-Hung Lin, Hsin-Chu (TW); Wen-Sung Hsu, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 17/361,285

(22) Filed: Jun. 28, 2021

(65) Prior Publication Data

US 2021/0327835 A1    Oct. 21, 2021

Related U.S. Application Data

(62) Division of application No. 16/452,395, filed on Jun. 25, 2019, now Pat. No. 11,081,453.
(Continued)

(51) Int. Cl.
*H01L 23/66* (2006.01)
*H01L 23/31* (2006.01)
(Continued)

(52) U.S. Cl.
CPC .......... *H01L 23/66* (2013.01); *H01L 23/3128* (2013.01); *H01L 23/3135* (2013.01);
(Continued)

(58) Field of Classification Search
CPC ...... H01Q 1/2283; H01Q 9/0407; H01Q 9/16; H01L 2223/667; H01L 23/28–3192; H01L 23/66
See application file for complete search history.

(56) References Cited

U.S. PATENT DOCUMENTS 8,269,671 B2   9/2012   Chen et al.
8,779,564 B1   7/2014   Knudsen et al.
(Continued)

FOREIGN PATENT DOCUMENTS

CN   107093598 A   8/2017
EP     3091571 A2   11/2016
TW   201742310 A   12/2016

OTHER PUBLICATIONS

Extended European Search Report dated Oct. 29, 2019 in connection with European Application No. 19184163.4.
(Continued)

*Primary Examiner* — Victoria K. Hall
(74) *Attorney, Agent, or Firm* — Wolf, Greenfield & Sacks, P.C.

(57) ABSTRACT

A semiconductor package structure is provided. The semiconductor package structure includes a first redistribution layer (RDL) structure formed on a non-active surface of a semiconductor die. A second RDL structure is formed on and electrically coupled to an active surface of the semiconductor die. A ground layer is formed in the first RDL structure. A first molding compound layer is formed on the first RDL structure. A first antenna includes a first antenna element formed in the second RDL structure and a second antenna element formed on the first molding compound layer. Each of the first antenna element and the second antenna element has a first portion overlapping the semiconductor die as viewed from a top-view perspective.

13 Claims, 8 Drawing Sheets

Related U.S. Application Data

(60) Provisional application No. 62/693,501, filed on Jul. 3, 2018.

(51) Int. Cl.
*H01L 23/48* (2006.01)
*H01L 23/498* (2006.01)
*H01Q 1/22* (2006.01)
*H01Q 9/04* (2006.01)
*H01Q 9/16* (2006.01)
H01L 23/552 (2006.01)
H01Q 1/52 (2006.01)

(52) U.S. Cl.
CPC ...... *H01L 23/481* (2013.01); *H01L 23/49822* (2013.01); *H01Q 1/2283* (2013.01); *H01Q 9/0407* (2013.01); *H01Q 9/16* (2013.01); H01L 23/552 (2013.01); H01L 2223/6677 (2013.01); H01Q 1/526 (2013.01)

(56) References Cited

U.S. PATENT DOCUMENTS

| | | | |
|---|---|---|---|
| 10,276,511 B1* | 4/2019 | Tsai | H01L 23/49822 |
| 10,366,966 B1 | 7/2019 | Wan et al. | |
| 10,461,034 B2 | 10/2019 | Wu et al. | |
| 10,475,757 B2* | 11/2019 | Wan | H01Q 1/2283 |
| 10,511,080 B2* | 12/2019 | So | H01Q 1/38 |
| 10,594,019 B2 | 3/2020 | Baks et al. | |
| 10,608,319 B2 | 3/2020 | Kim et al. | |
| 10,741,509 B2 | 8/2020 | Kim et al. | |
| 10,840,578 B2 | 11/2020 | Yu et al. | |
| 10,867,938 B2 | 12/2020 | Tang et al. | |
| 10,868,353 B2 | 12/2020 | Lu et al. | |
| 10,957,679 B2 | 3/2021 | Lee et al. | |
| 10,971,460 B2* | 4/2021 | Yu | H01Q 1/38 |
| 10,971,461 B2* | 4/2021 | Tsai | H01L 23/3107 |
| 11,004,796 B2* | 5/2021 | Tu | H01L 24/19 |
| 11,011,827 B2* | 5/2021 | Thai | H01Q 1/243 |
| 11,063,007 B2* | 7/2021 | Chuang | H01L 23/5384 |
| 11,081,453 B2* | 8/2021 | Liu | H01L 23/3135 |
| 11,095,037 B2* | 8/2021 | Kim | H01Q 15/08 |
| 11,107,781 B2* | 8/2021 | Pietambaram | H01L 23/5389 |
| 11,195,787 B2* | 12/2021 | Huynh | H01Q 9/0407 |
| 11,264,316 B2* | 3/2022 | Wang | H01L 21/565 |
| 11,309,619 B2* | 4/2022 | Oster | H01P 5/18 |
| 11,335,655 B2* | 5/2022 | Wan | H01L 23/481 |
| 11,346,936 B2* | 5/2022 | Baheti | A61B 5/0022 |
| 11,373,957 B2* | 6/2022 | Hsu | H01L 25/16 |
| 11,394,109 B2* | 7/2022 | Ndip | H01Q 1/2283 |
| 11,424,197 B2* | 8/2022 | Wang | H01Q 21/205 |
| 11,482,788 B2* | 10/2022 | Wang | H01Q 3/24 |
| 2012/0280860 A1* | 11/2012 | Kamgaing | H01L 23/66 29/601 |
| 2013/0194754 A1* | 8/2013 | Jung | H05K 1/0204 361/720 |
| 2013/0292808 A1 | 11/2013 | Yen et al. | |
| 2014/0028518 A1 | 1/2014 | Arnold et al. | |
| 2014/0252595 A1 | 9/2014 | Yen et al. | |
| 2015/0070228 A1 | 3/2015 | Gu et al. | |
| 2015/0084180 A1 | 3/2015 | Seko et al. | |
| 2015/0325925 A1 | 11/2015 | Kamgaing et al. | |
| 2015/0340765 A1 | 11/2015 | Dang et al. | |
| 2016/0087333 A1 | 3/2016 | Tong et al. | |
| 2016/0218072 A1 | 7/2016 | Liao et al. | |
| 2016/0329299 A1 | 11/2016 | Lin et al. | |
| 2017/0033062 A1 | 2/2017 | Liu et al. | |
| 2017/0181287 A1 | 6/2017 | Jhang et al. | |
| 2017/0236776 A1* | 8/2017 | Huynh | H01L 23/49822 438/26 |
| 2017/0345731 A1* | 11/2017 | Chiang | G06V 40/1306 |
| 2017/0346185 A1* | 11/2017 | Wang | H01Q 1/2283 |
| 2018/0025999 A1 | 1/2018 | Yu et al. | |
| 2018/0034134 A1 | 2/2018 | Dalmia | |
| 2018/0053735 A1 | 2/2018 | Ueda | |
| 2018/0158787 A1 | 6/2018 | Chang et al. | |
| 2018/0159203 A1* | 6/2018 | Baks | H01Q 1/48 |
| 2018/0166405 A1 | 6/2018 | Chiang et al. | |
| 2018/0247905 A1 | 8/2018 | Yu et al. | |
| 2018/0286822 A1* | 10/2018 | Kim | H01Q 1/2283 |
| 2018/0342470 A1 | 11/2018 | Liao et al. | |
| 2018/0342788 A1 | 11/2018 | Lasiter et al. | |
| 2018/0350772 A1* | 12/2018 | Nair | H01L 23/66 |
| 2018/0358685 A1 | 12/2018 | Han et al. | |
| 2019/0027449 A1 | 1/2019 | Wan | H01L 23/3135 |
| 2019/0035737 A1 | 1/2019 | Wu et al. | |
| 2019/0058241 A1* | 2/2019 | So | H01L 24/20 |
| 2019/0067220 A1 | 2/2019 | Wan et al. | |
| 2019/0096829 A1 | 3/2019 | Tang et al. | |
| 2019/0097304 A1* | 3/2019 | Hsiao | H01L 23/49838 |
| 2019/0103652 A1* | 4/2019 | Chuang | H01Q 21/24 |
| 2019/0122978 A1* | 4/2019 | Tang | H01L 23/485 |
| 2019/0139915 A1* | 5/2019 | Dalmia | H01L 23/552 |
| 2019/0157206 A1* | 5/2019 | Wang | H01L 21/6835 |
| 2019/0166686 A1* | 5/2019 | Jo | H01Q 9/0414 |
| 2019/0181096 A1 | 6/2019 | Wu et al. | |
| 2019/0189572 A1* | 6/2019 | Chiang | H01L 23/5226 |
| 2019/0279950 A1 | 9/2019 | Kim et al. | |
| 2019/0279951 A1* | 9/2019 | Chiang | H01L 24/92 |
| 2019/0280374 A1* | 9/2019 | Kim | H01L 23/5389 |
| 2019/0288373 A1* | 9/2019 | Chen | H01Q 1/2283 |
| 2019/0319337 A1 | 10/2019 | Yen | |
| 2019/0333880 A1* | 10/2019 | Chen | H01L 24/19 |
| 2019/0348747 A1* | 11/2019 | Liu | H01L 23/5386 |
| 2019/0348748 A1 | 11/2019 | Liu et al. | |
| 2019/0348756 A1 | 11/2019 | Liu et al. | |
| 2019/0355694 A1 | 11/2019 | Wan et al. | |
| 2019/0393172 A1 | 12/2019 | Pietambaram | H01L 24/19 |
| 2020/0006853 A1* | 1/2020 | Park | H01Q 9/0407 |
| 2020/0007103 A1* | 1/2020 | Nam | H05K 9/0064 |
| 2020/0013735 A1 | 1/2020 | Liu et al. | |
| 2020/0035625 A1* | 1/2020 | Wang | H01L 23/49816 |
| 2020/0066663 A1* | 2/2020 | Aleksov | H01L 23/66 |
| 2020/0091608 A1 | 3/2020 | Alpman et al. | |
| 2020/0176863 A1* | 6/2020 | Luna | H01Q 1/002 |
| 2021/0082842 A1* | 3/2021 | He | H01L 23/66 |
| 2022/0336385 A1* | 10/2022 | Wang | H01L 23/49827 |

OTHER PUBLICATIONS

Communication pursuant to Article 94(3) EPC dated May 4, 2021 in connection with European Application No. 19184163.4.
Pozar, A review of aperture coupled microstrip antennas: history, operation, development, and applications. University of Massachusetts at Amherst. May 1, 1996:12 pages.
Khalily et al., Broadband mm-wave microstrip array antenna with improved radiation characteristics for different 5G applications. IEEE Transactions on Antennas and Propagation. Sep. 2018;9 pages.

* cited by examiner

SEMICONDUCTOR PACKAGE STRUCTURE WITH ANTENNA

CROSS REFERENCE TO RELATED APPLICATIONS

This Application is a Division of U.S. application Ser. No. 16/452,395, filed Jun. 25, 2019, and entitled "SEMICONDUCTOR PACKAGE STRUCTURE WITH ANTENNA", which claims the benefit of U.S. Provisional Application No. 62/693,501 filed on Jul. 3, 2018 and entitled "NOVEL AIP 3D FAN OUT STRUCTURE," the entirety of which is incorporated by reference herein.

BACKGROUND OF THE INVENTION

Field of the Invention

The present invention relates to a package structure, and in particular to a fan-out semiconductor package structure that includes antennas.

Description of the Related Art

In order to ensure the continued miniaturization and multi-functionality of electronic products and communication devices, semiconductor packages must be small in size, support multi-pin connection, operate at high speeds, and have high functionality. Additionally, in a high-frequency application such as a radio frequency (RF) system-in-package (SiP) assembly, antennas are typically used for enabling wireless communication.

When wireless communication packages with antennas are constructed, package designs need to provide good antenna properties (such as high efficiency, wide bandwidth, etc) while providing reliable and low-cost package solutions. In a conventional SiP structure, a discrete antenna component is individually encapsulated or mounted on a printed circuit board (PCB) or package. Since the PCB is required to provide a greater area on which to mount the antenna component, it is difficult to reduce the package size. Additionally, since the antenna mounted on the package cannot overlap the underlying semiconductor die, as viewed from a top-view perspective, it is difficult to reduce the size of semiconductor packages any further.

Thus, a novel semiconductor package structure is desirable.

BRIEF SUMMARY OF THE INVENTION

Semiconductor package structures are provided. An exemplary embodiment of a semiconductor package structure includes a semiconductor die and a first redistribution layer (RDL) structure formed on a non-active surface of the semiconductor die. The semiconductor package structure further includes a second RDL structure formed on and electrically coupled to an active surface of the semiconductor die, a ground layer formed in the first RDL structure, and a first molding compound layer formed on the first RDL structure. The semiconductor package structure further includes a first antenna that includes a first antenna element formed in the second RDL structure and a second antenna element formed on the first molding compound layer. Each of the first antenna element and the second antenna element has a first portion overlapping the semiconductor die as viewed from a top-view perspective.

Another exemplary embodiment of a semiconductor package structure includes a semiconductor die and a first RDL structure formed on a non-active surface of the semiconductor die. The semiconductor package structure further includes a second RDL structure formed on and electrically coupled to an active surface of the semiconductor die, a ground layer formed in the first RDL structure, and a first molding compound layer formed on the first RDL structure. The semiconductor package structure further includes patch antennas. Each of the patch antennas includes a first antenna element formed in the second RDL structure and a second antenna element formed on the first molding compound layer. The first antenna element has a first portion overlapping the semiconductor die as viewed from a top-view perspective. The semiconductor package structure further includes a metal isolation layer formed on the first molding compound layer to isolate the second antenna element of the antennas from each other. The semiconductor package structure further includes a first through via structure formed in the first molding compound layer and electrically coupled between the ground layer and the metal isolation layer.

Yet another exemplary embodiment of a semiconductor package structure includes a semiconductor die and a first RDL structure formed on a non-active surface of the semiconductor die. The semiconductor package structure further includes a ground layer formed in the first RDL structure, a second RDL structure formed on the first RDL structure, and a first molding compound layer formed on the second RDL structure. The semiconductor package structure further includes a first antenna that includes a first antenna element formed in the second RDL structure and a second antenna element formed on the first molding compound layer. Each of the first antenna element and the second antenna element has a first portion overlapping the semiconductor die as viewed from a top-view perspective.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
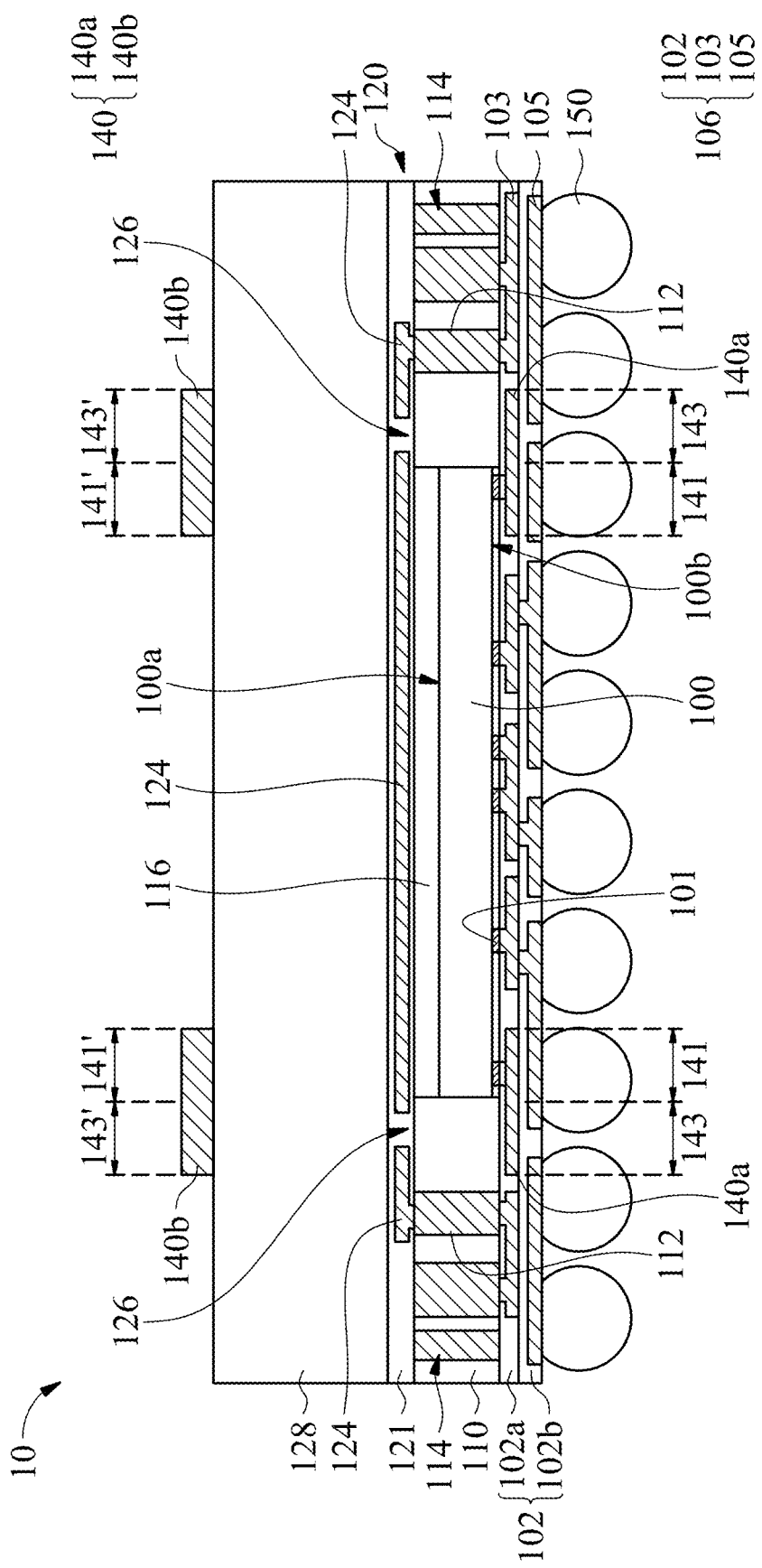
FIG. 1 is a cross-sectional view of an exemplary semiconductor package structure in accordance with some embodiments.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a cross-sectional view of an exemplary semiconductor package structure 10 in accordance with some embodiments. In some embodiments, the semiconductor package structure 10 is a wafer-level semiconductor package structure, and is a flip-chip semiconductor package structure. As shown in FIG. 1, the semiconductor package structure 10 is mounted on a base (not shown), in accordance with some embodiments. For example, the semiconductor package structure 10 may be a system-on-chip (SOC) package structure. Moreover, the base may include a printed circuit board (PCB) and may be formed of polypropylene (PP).

Alternatively, the base is a package substrate. The semiconductor package structure 10 is mounted onto the base by a bonding process. For example, the semiconductor package structure 10 includes conductive structures 150 that is mounted on and electrically coupled to the base by the bonding process. In some embodiments, each of the conductive structures 150 includes a conductive bump structure such as a copper bump or a solder bump structure, as shown in FIG. 1. Alternatively, each of the conductive structures 150 includes a conductive pillar structure, a conductive wire structure, or a conductive paste structure.

In some embodiments, the semiconductor package structure 10 further includes a semiconductor die 100, such as a system-on-chip (SOC) die. For example, the SOC die may includes a microcontroller (MCU), a microprocessor (MPU), a power management integrated circuit (PMIC), a global positioning system (GPS) device, or a radio frequency (RF) device or any combination thereof.

In some embodiments, the semiconductor die 100 has two opposing sides. More specifically, the semiconductor die 100 has a non-active surface 100a and an active surface 100b opposite to the non-active surface 100a. The non-active surface 100a may also be referred to as a rear surface and the active surface 100b may also be referred to as a front surface that is opposite to the rear surface. In some embodiments, the semiconductor die 100 includes pads 101 that are disposed on the active surface 100b and electrically connected to the circuitry (not shown) of the semiconductor die 100. In some embodiments, the pads 101 of the semiconductor die 100 belong to the uppermost metal layer of the interconnection structure (not shown) of the semiconductor die 100.

It should be noted that the number of semiconductor dies integrated in the semiconductor package structure 10 is not limited to that disclosed in the embodiment.

In some embodiments, the semiconductor package structure 10 further includes a molding compound layer 110 surrounds the semiconductor die 100. In some embodiments, the molding compound layer 110 is formed of an epoxy, a resin, a moldable polymer, or the like. The molding compound layer 110 may be applied while substantially liquid, and then may be cured through a chemical reaction, such as in an epoxy or resin. In some other embodiments, the molding compound layer 110 may be an ultraviolet (UV) or thermally cured polymer applied as a gel or malleable solid capable of being disposed around the semiconductor die 100, and then is cured through a UV or thermal curing process. The molding compound layer 110 may be cured with a mold (not shown).

In some embodiments, the semiconductor package structure 10 further includes a redistribution layer (RDL) structure 106 formed below the active surface 100b of the semiconductor die 100 and the bottom of the molding compound layer 110. The RDL structure 106, which is also referred to as a fan-out structure. The RDL structure 106 disposed on the active surface 100b of the semiconductor die 100 is electrically connected to the semiconductor die 100 through the pads 101 of the semiconductor die 100. Moreover, the conductive structures 150 are mounted on and electrically coupled to the RDL structure 106, such that the conductive structures 150 are separated from the molding compound layer 110 and the semiconductor die 100 through the RDL structure 106. In other words, the conductive structures 150 are free from contact with the molding compound layer 110 and the semiconductor die 100.

In some embodiments, the RDL structure 106 includes one or more conductive traces disposed in an inter-metal dielectric (IMD) layer 102. Conductive traces 103 are disposed at a first layer-level of the IMD layer 102 and at least one of the conductive traces 103 is electrically coupled to the semiconductor die 100. Moreover, conductive traces 105 are disposed at a second layer-level that is different from the first layer-level of the IMD layer 102. Moreover, at least one of the conductive traces 105 is electrically coupled to one or more conductive structures 150, so that the conductive structures 150 are electrically coupled to the semiconductor die 100 via the RDL structure 106.

For example, the IMD layer 102 may include a first sub-dielectric layer 102a and a second sub-dielectric layer 102b successively stacked from the active surface 100b of the semiconductor die 100, such that the conductive traces 103 are formed in the first sub-dielectric layer 102a, and the conductive traces 105 are formed in the second sub-dielectric layer 102b.

In some embodiments, the IMD layer 102 is formed of an organic material, which includes a polymer base material, a non-organic material, which includes silicon nitride ($SiN_x$), silicon oxide ($SiO_x$), graphene, or the like. For example, the first sub-dielectric layers 102a and the second sub-dielectric layer 102b may be made of a polymer base material. In some other embodiments, the IMD layer 102 is formed of a high-k (k is the dielectric constant of the dielectric layer) dielectric layer. In some other embodiments, the IMD layer 102 is formed of a photo-sensitive material, which may include a dry film photoresist, or a taping film.

It should be noted that the number of conductive traces and the number of sub-dielectric layers of the RDL structure 106 shown in FIG. 1 are only an example and are not a limitation to that disclosed in the embodiment.

In some embodiments, the semiconductor package structure 10 further includes one or more through via structures 112 formed in and passing through the molding compound layer 110. The through via structures 112 are electrically coupled to the conductive traces 103 of the RDL structure 106. The through via structures 112 may be referred to as through insulator vias (TIVs) and be formed of copper.

In some embodiments, the semiconductor package structure 10 further includes an RDL structure 120 formed above the non-active surface 100a of the semiconductor die 100 and the top of the molding compound layer 110. The RDL structure 120 may have a structure similar to the RDL structure 106 and may be also referred to as a fan-out structure. In some embodiments, the non-active surface 100a of the semiconductor die 100 is adhered to the RDL structure 120 via an adhesion layer 116, such that the semiconductor die 100 and the molding compound layer 110 are interposed between the RDL structure 106 and the RDL structure 120.

In some embodiments, the RDL structure 120 disposed on the non-active surface 100a of the semiconductor die 100 and the top of the molding compound layer 110 includes an IMD layer 121 and conductive traces (not shown) formed in the IMD layer 121. The IMD layer 121 may be a single layer or a multi-layer structure. The method and material used for forming the IMD layer 121 may be the same as or similar to those of the IMD layer 102. Similarly, the method and material used for forming the conductive traces of the RDL structure 120 may be the same as or similar to those of the conductive traces 103 and 105 of the RDL structure 106. In other words, the process for forming the RDL structure 106 can be used for forming the RDL structure 120.

In some embodiments, the semiconductor package structure 10 further includes a molding compound layer 128 formed on the RDL structure 120 above the non-active surface 100a of the semiconductor die 100 and the molding compound layer 110. Therefore, the RDL structure 120 separates the semiconductor die 100 from the molding compound layer 128. In some embodiments, the method and material used for forming the molding compound layer 128 may be the same as or similar to those of the molding compound layer 110.

In some embodiments, the semiconductor package structure 10 further includes one or more antennas 114 and one or more antennas 140 therein and electrically coupled to the semiconductor die 100. More specifically, in some embodiments, the antenna 114 is formed in the molding compound layer 110, and the through via structure 112 in the molding compound layer 110 is disposed between the semiconductor die 100 and the antenna 114. The antenna 114 is electrically coupled to the semiconductor die 100 via at least one of the conductive traces 103 of the RDL structure 106. The antenna 114 is also electrically coupled to the RDL structure 120 via at least one of the conductive traces 103 of the RDL structure 106 and the through via structure 112 in the molding compound layer 110. In some embodiments, the antenna 114 is a dipole antenna. In some embodiments, the methods and materials used for forming the antenna 114 may be the same as or similar to those of the through via structure 112.

In some embodiments, unlike the antenna 114 (e.g., the dipole antenna), the antenna 140 includes a first antenna element 140a and a second antenna element 140b that is separated from the first antenna element 140a. More specifically, in some embodiments, the first antenna element 140a is embedded in the IMD layer 102 of the RDL structure 120 (e.g., the first sub-dielectric layer 102a), so that the first antenna element 140a is formed below the molding compound layer 110 and the active surface 100b of the semiconductor die 100. The second antenna element 140b is formed on and in direct contact with the molding compound layer 128, so that the first antenna element 140a is separated from the second antenna element 140b at least by the molding compound layer 110 and the molding compound layer 128. In some embodiments, the first antenna element 140a has a first portion 141 and the second antenna element 140b has a first portion 141'. Those first portions 141 and 141' overlap the semiconductor die 100 as viewed from a top-view perspective. In such cases, the first antenna element 140a has a second portion 143 adjoining the first portion 141, and second antenna element 140b has a second portion 143' adjoining the first portion 141'. Those second portions 143 and 143' do not cover the semiconductor die 100 as viewed from a top-view perspective.

In some embodiments, the antenna 140 is a patch antenna using the molding compound layer 128 and the molding compound layer 110 as a resonator. Therefore, the thicknesses of the molding compound layer 128 and the molding compound layer 110 depend on the desired dielectric constant ($D_k$) and the desired dissipation factor ($D_f$, which is also referred to as loss tangent) for the antenna 140 (e.g., the patch antenna). In some embodiments, the first antenna element 140a is formed of at least one of the conductive traces 103 in the RDL structure 106. In such cases, the methods and materials used for forming the first antenna element 140a may be the same as or similar to those of the conductive traces 103 and 105 in the IMD layer 102 of the RDL structure 106. Moreover, the first antenna element 140a is electrically coupled to the semiconductor die 100, such that the antenna 140 is electrically coupled to the semiconductor die 100.

In some embodiments, the semiconductor package structure 10 further includes a ground layer 124 formed in the IMD layer 121 of the RDL structure 120. In some embodiments, the ground layer 124 covers the entire non-active surface 100a of the semiconductor die 100. In such cases, the ground layer 124 may also serve as a shielding layer for the semiconductor die 100. As a result, it can allow that the first antenna element 140a and the second antenna element 140b of the antenna 140 partially overlap the underlying semiconductor die 100, as viewed from a top-view perspective. Therefore, the size of the semiconductor package structure 10 can be reduced. In such cases, the ground layer 124 has a through-opening 126 overlapping the corresponding second portion 143 of the first antenna element 140a and the corresponding second portion 143' of the second antenna element 140b, as viewed from a top-view perspective. As a result, the first antenna element 140a can be coupled to the corresponding second antenna element 140b via the corresponding through-opening 126. In other words, the through-opening 126 prevents the first antenna element 140a and the second antenna element 140b from being shielded by the ground layer 124.

In some embodiments, the ground layer 124 is electrically coupled to the antenna 114 formed in the molding compound layer 110 by the corresponding through via structure 112 and the RDL structure 106. For example, the through via structure 112 formed in the molding compound layer 110 is electrically coupled between the ground layer 124 and at least one of the conductive traces 103 of the RDL structure 106.

In some embodiments, the ground layer 124 is formed of at least one of the conductive traces in the RDL structure 120. In such cases, the method and material used for forming the ground layer 124 may be the same as or similar to those of the conductive traces 103 and 105 in the IMD layer 102 of the RDL structure 106.

Figure 2A:
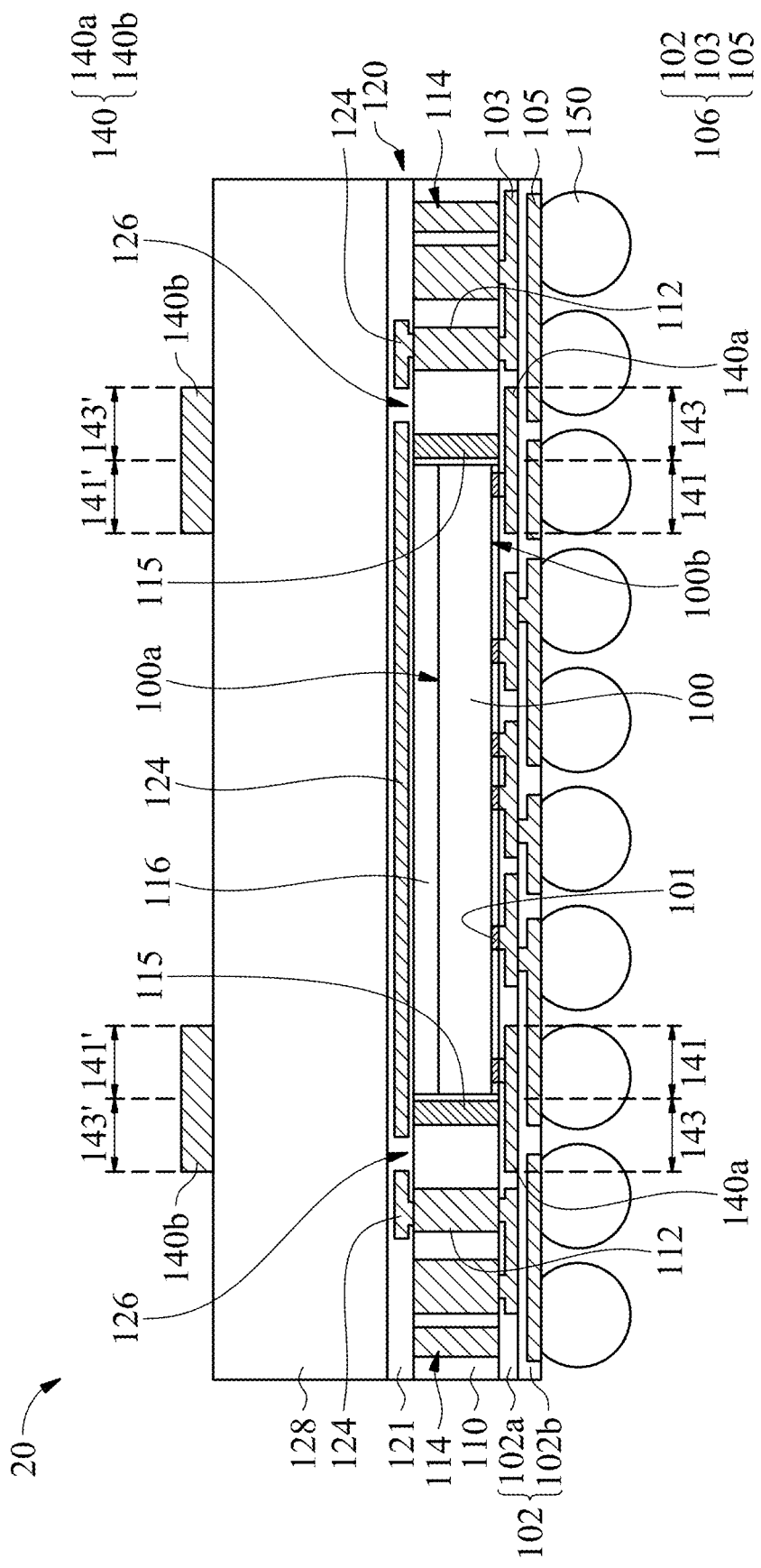
FIG. 2A is a cross-sectional view of an exemplary semiconductor package structure in accordance with some embodiments.

FIG. 2A is a cross-sectional view of an exemplary semiconductor package structure 20 in accordance with some embodiments of the disclosure. Descriptions of elements of the embodiments hereinafter that are the same as or similar to those previously described with reference to FIG. 1 may be omitted for brevity. In the embodiment, the semiconductor package structure 20 is similar to the semiconductor package structure 10 shown in FIG. 1, except that the semiconductor package structure 20 further includes dummy metal through via structures 115 formed in the molding compound layer 110.

Figure 2B:
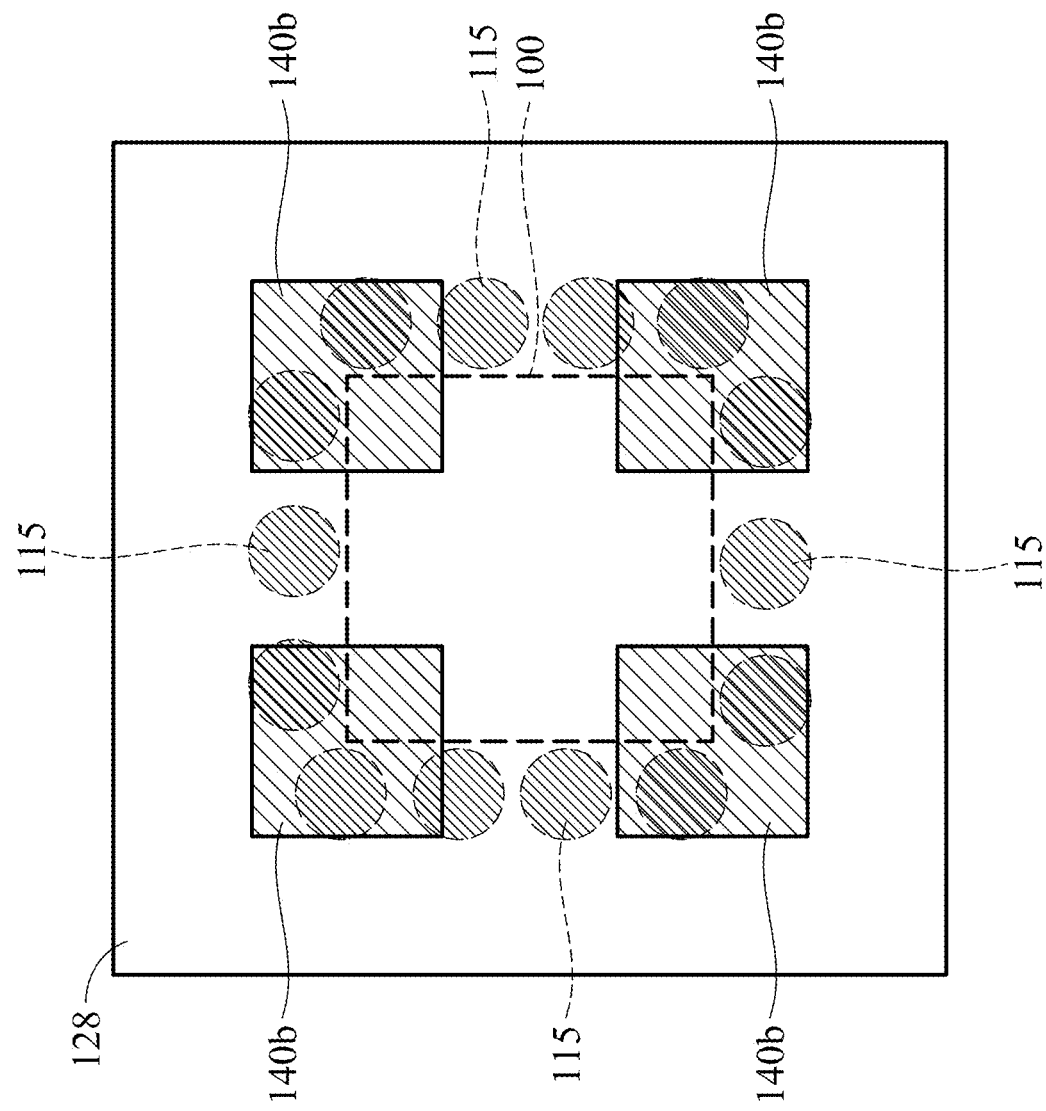
FIG. 2B is a plan view of an exemplary configuration of dummy metal through via structures in the semiconductor package structure of FIG. 2A in accordance with some embodiments.

FIG. 2B is a plan view of an exemplary configuration of dummy metal through via structures 115 in the semiconductor package structure 20 of FIG. 2A in accordance with some embodiments. As shown in FIG. 2B, the dummy metal through via structures 115 surround the semiconductor die 100 to serve as an additional shielding structure for the sidewalls of the semiconductor die 100. In some embodiments, those dummy metal through via structures 115 are electrically isolated from the RDL structure 106 and the RDL structure 120. In some embodiments, at least one of the plurality of dummy metal through via structures 115 overlaps the second portion 143 of the first antenna element 140a and the second portion 143' of the second antenna element 140b, as viewed from a top-view perspective. Those dummy metal through via structures 115 in the molding compound layer 110 may be disposed between the semiconductor die 100 and the antenna 114 and/or the through via structures 112.

In some embodiments, the method and material used for forming the dummy metal through via structures 115 may be the same as or similar to those of the through via structures 112.

It should be noted that the number of dummy metal through via structures 115, and the shape and the size of the dummy metal through via structure 115 shown in FIG. 2B are only an example and are not a limitation to that disclosed in the embodiment. It should also be noted that the number and the arrangement of second antenna elements 140b, and the shape and the size of the second antenna element 140b shown in FIG. 2B are only an example and are not a limitation to that disclosed in the embodiment.

Figure 3A:
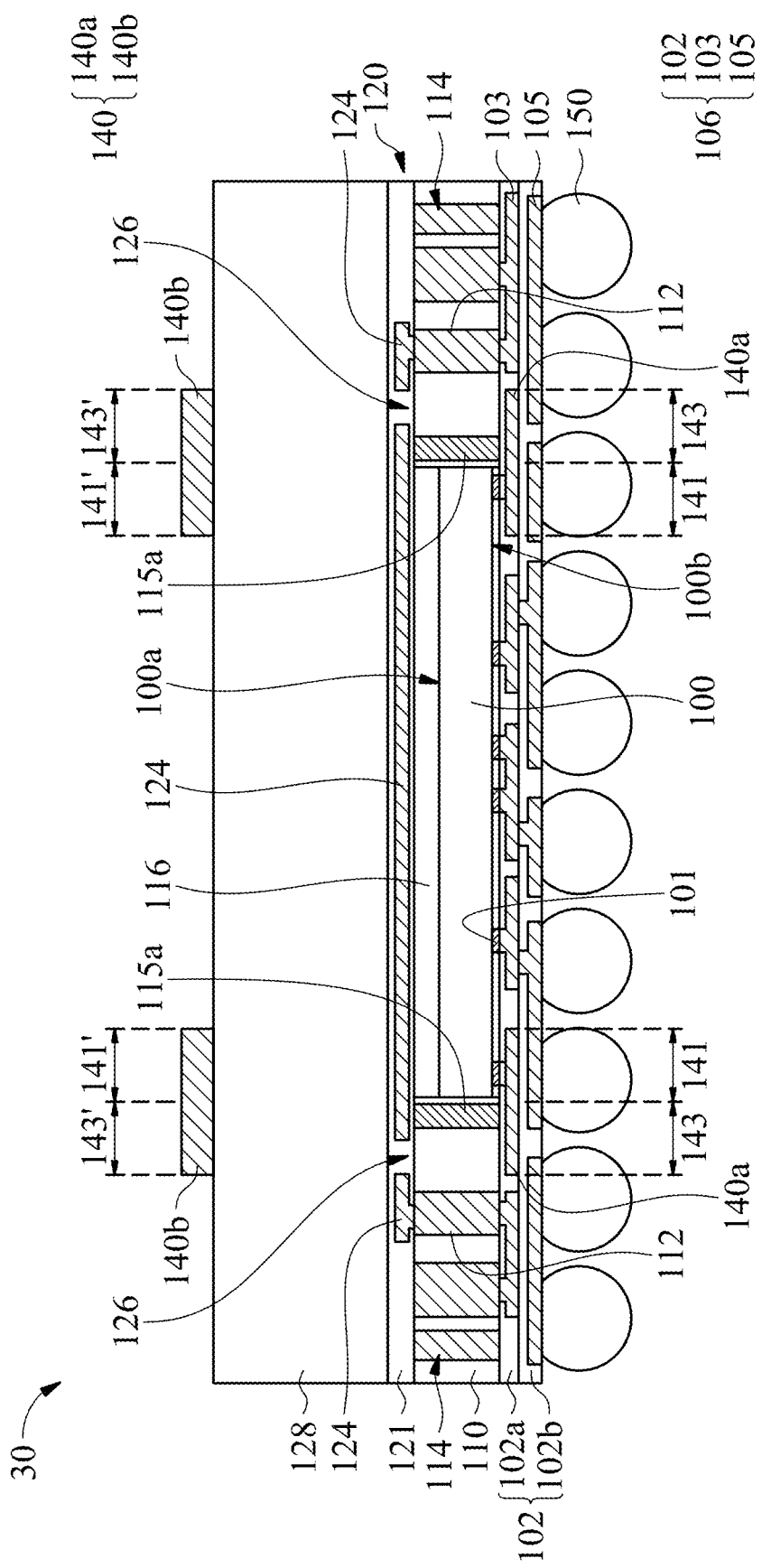
FIG. 3A is a cross-sectional view of an exemplary semiconductor package structure in accordance with some embodiments.

FIG. 3A is a cross-sectional view of an exemplary semiconductor package structure 30 in accordance with some embodiments of the disclosure. Descriptions of elements of the embodiments hereinafter that are the same as or similar to those previously described with reference to FIG. 1 may be omitted for brevity. In the embodiment, the semiconductor package structure 30 is similar to the semiconductor package structure 10 shown in FIG. 1, except that the semiconductor package structure 30 further includes a metal dam 115a formed in the molding compound layer 110.

Figure 3B:
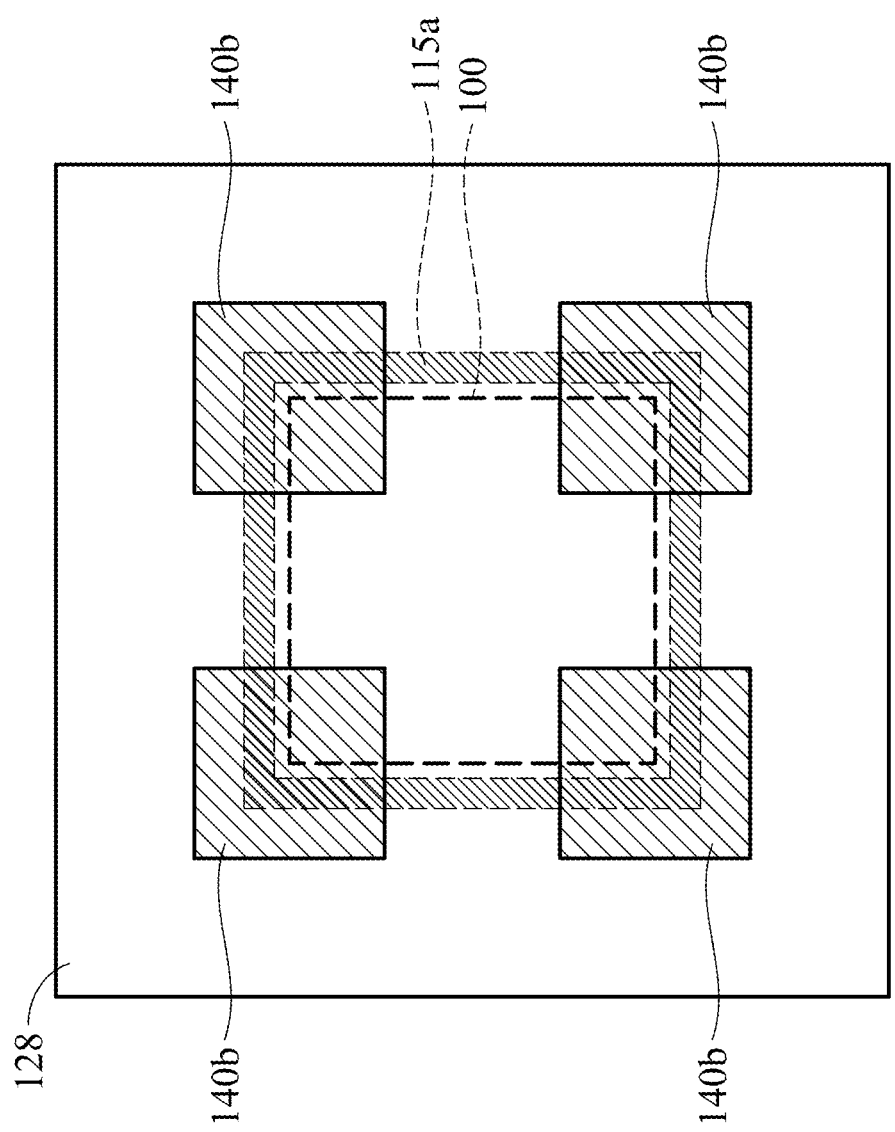
FIG. 3B is a plan view of an exemplary configuration of a metal dam in the semiconductor package structure of FIG. 3A in accordance with some embodiments.

FIG. 3B is a plan view of an exemplary configuration of a metal dam 115a in the semiconductor package structure 30 of FIG. 3A in accordance with some embodiments. Similar to the dummy metal through via structures 115 shown in FIGS. 2A and 2B, the metal dam 115a surrounds the semiconductor die 100 to serve as an additional shielding structure for the sidewalls of the semiconductor die 100. In some embodiments, the metal dam 115a is electrically isolated from the RDL structure 106 and the RDL structure 120. In some embodiments, the metal dam 115a overlaps the second portion 143 of the first antenna element 140a and the second portion 143' of the second antenna element 140b, as viewed from a top-view perspective. The metal dam 115a in the molding compound layer 110 may be disposed between the semiconductor die 100 and the antenna 114 and/or the through via structures 112.

In some embodiments, the method and material used for forming the metal dam 115a may be the same as or similar to those of the through via structures 112.

It should be noted that the shape and the size of the metal dam 115a shown in FIG. 3B are only an example and are not a limitation to that disclosed in the embodiment. It should also be noted that the number and the arrangement of second antenna elements 140b, and the shape and the size of the second antenna element 140b shown in FIG. 3B are only an example and are not a limitation to that disclosed in the embodiment.

Figure 4A:
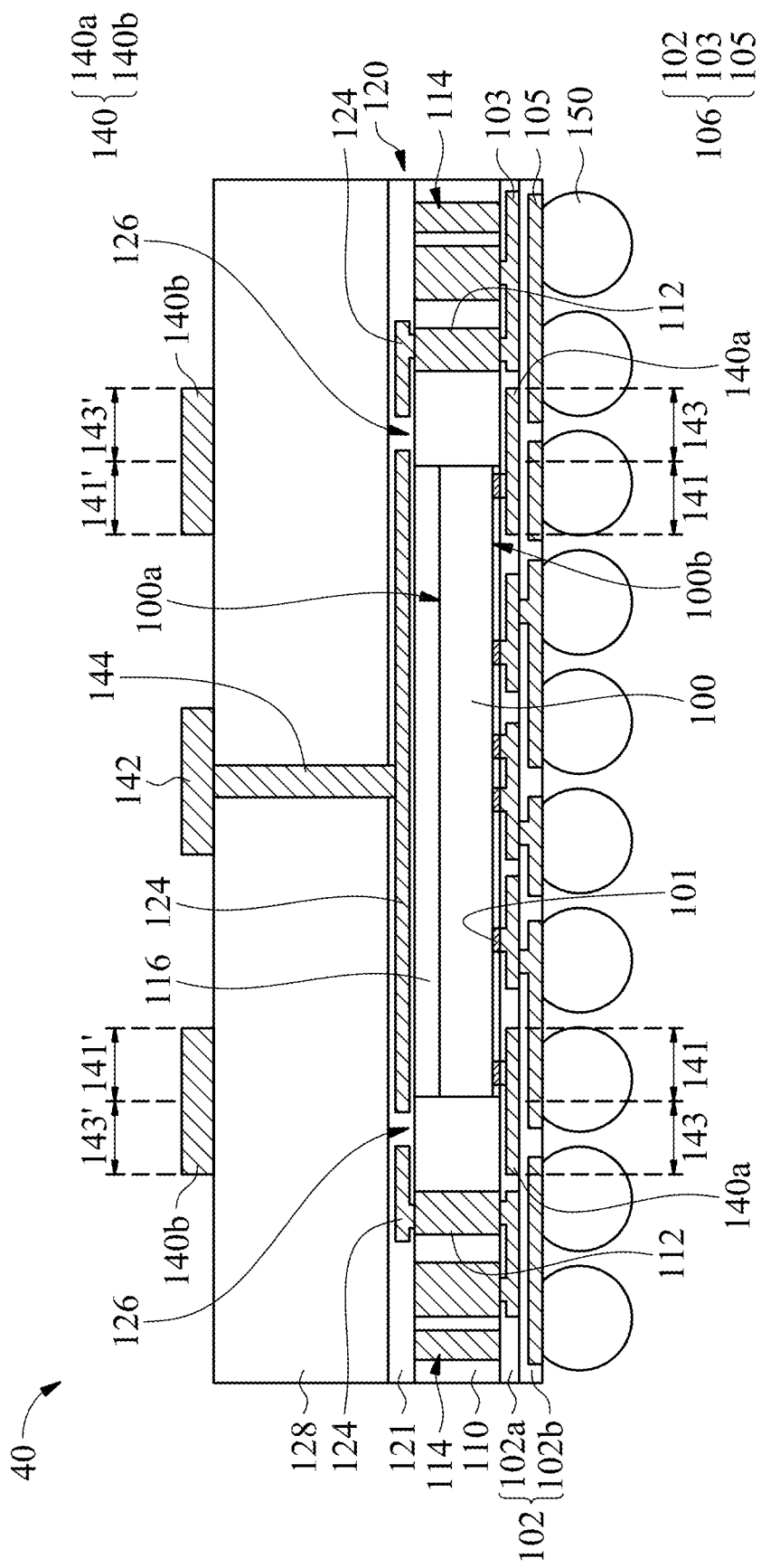
FIG. 4A is a cross-sectional view of an exemplary semiconductor package structure in accordance with some embodiments.

FIG. 4A is a cross-sectional view of an exemplary semiconductor package structure 40 in accordance with some embodiments of the disclosure. Descriptions of elements of the embodiments hereinafter that are the same as or similar to those previously described with reference to FIG. 1 may be omitted for brevity. In the embodiment, the semiconductor package structure 40 is similar to the semiconductor package structure 10 shown in FIG. 1, except that the semiconductor package structure 40 further includes a metal isolation layer 142 formed on the molding compound layer 128, and a through via structure 144 formed in the molding compound layer 128. In some embodiments, the through via structure 144 formed in the molding compound layer 128 is electrically coupled between the ground layer 124 and the metal isolation layer 142. The method and material used for forming the through via structure 144 may be the same as or similar to those of the through via structures 112.

Figure 4B:
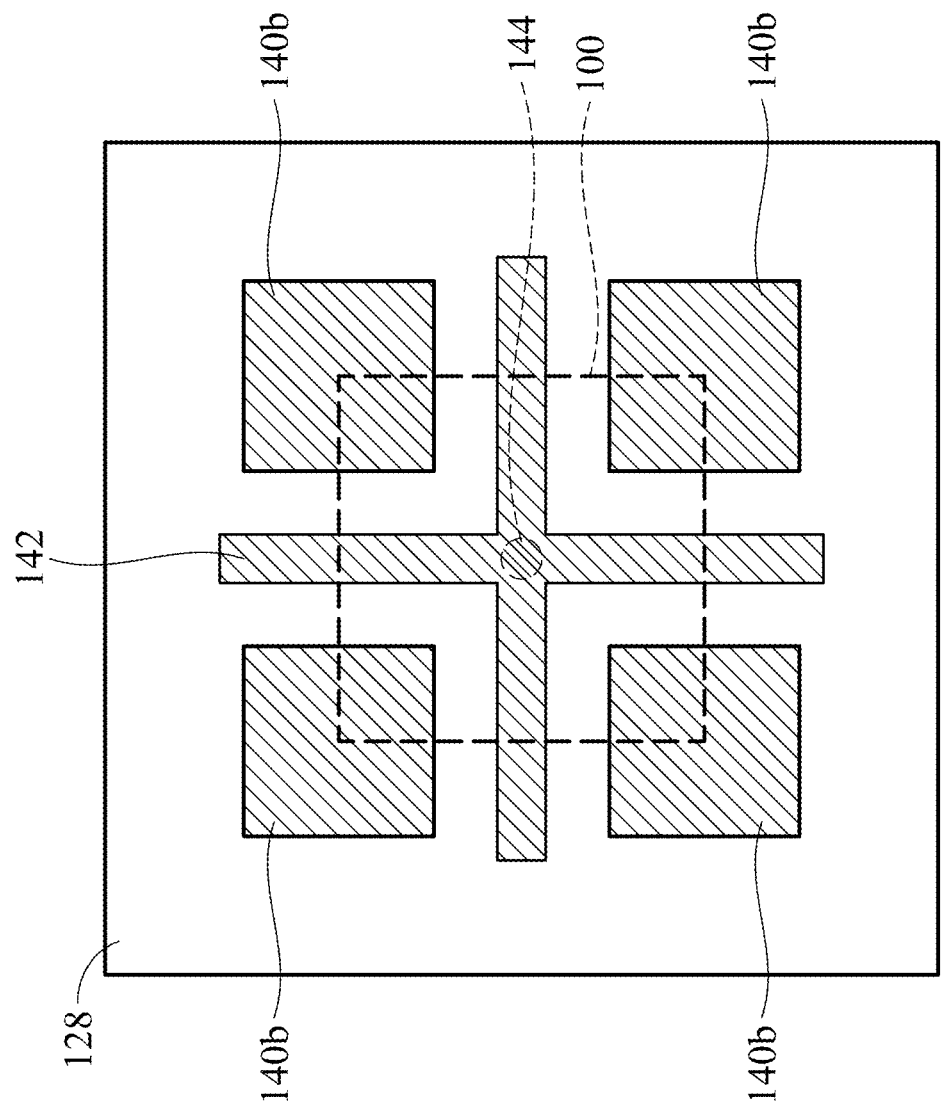
FIG. 4B is a plan view of an exemplary configuration of a metal isolation layer in the semiconductor package structure of FIG. 4A in accordance with some embodiments.

FIG. 4B is a plan view of an exemplary configuration of a metal isolation layer in the semiconductor package structure 40 of FIG. 4A in accordance with some embodiments. As shown in FIG. 4B, the metal isolation layer 142 serves as an additional shielding structure for isolating the second antenna element 140b of the antennas 140 (e.g., the patch antennas) from each other. The method and material used for forming the metal isolation layer 142 may be the same as or similar to those of the second antenna element 140b of the antennas 140.

It should be noted that the number of through via structure 144, and the shape and the size of the through via structure 144 and those of the metal isolation layer 142 shown in FIG. 4B are only an example and are not a limitation to that disclosed in the embodiment. It should also be noted that the number and the arrangement of second antenna elements 140b, and the shape and the size of the second antenna element 140b shown in FIG. 4B are only an example and are not a limitation to that disclosed in the embodiment.

In some other embodiments, the semiconductor package structure 40 further includes dummy metal through via structures (not shown) formed in the molding compound layer 110 and surrounding the semiconductor die 100. The structure and configuration of those dummy metal through via structures may be the same as or similar to those of the dummy metal through via structures 115 shown in FIGS. 2A and 2B.

Alternatively, those dummy metal through via structures may be replaced by a metal dam (not shown). The structure and configuration of this metal dam may be the same as or similar to those of the metal dam 115a shown in FIGS. 3A and 3B.

Figure 5:
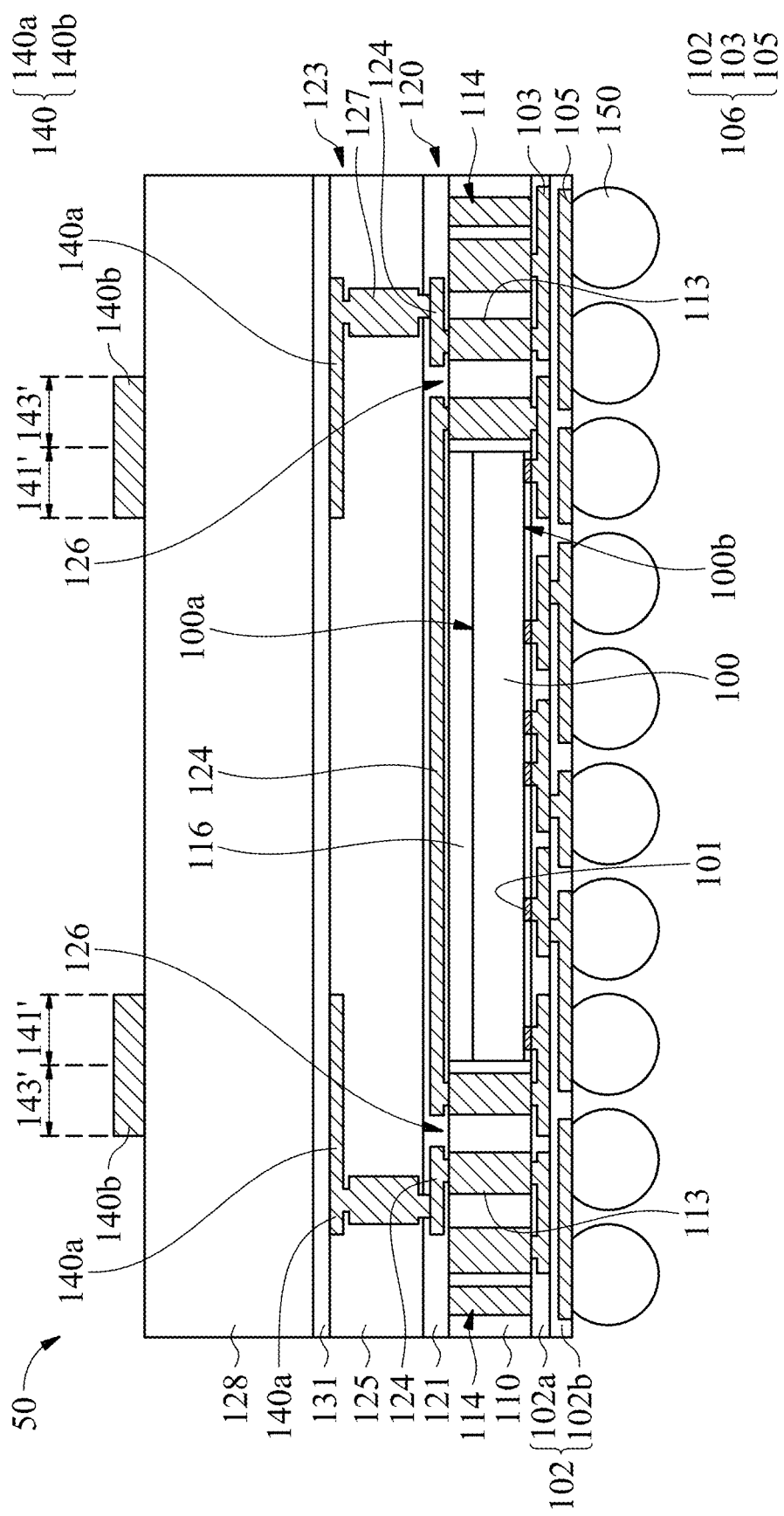
FIG. 5 is a cross-sectional view of an exemplary semiconductor package structure in accordance with some embodiments.

FIG. 5 is a cross-sectional view of an exemplary semiconductor package structure 50 in accordance with some embodiments of the disclosure. Descriptions of elements of the embodiments hereinafter that are the same as or similar to those previously described with reference to FIG. 1 may be omitted for brevity. In the embodiment, the semiconductor package structure 50 is similar to the semiconductor package structure 10 shown in FIG. 1. Unlike the semiconductor package structure 10, the semiconductor package structure 50 further includes an RDL structure 123 formed on the RDL structure 120 in accordance with some embodiments. In such cases, the RDL structure 123 is disposed between the RDL structure 120 and the molding compound layer 128. Moreover, one or more first antenna elements 140a are formed in the RDL structure 123. The RDL structure 123 may have a structure similar to the RDL structure 106 or 120.

In some embodiments, the RDL structure 123 includes an IMD layer 125 and conductive traces (not shown) formed in the IMD layer 125. The IMD layer 125 may be a single layer or a multi-layer structure. The method and material used for forming the IMD layer 125 may be the same as or similar to those of the IMD layer 102 or 121. Similarly, the method and material used for forming the conductive traces of the RDL structure 123 may be the same as or similar to those of the conductive traces 103 and 105 of the RDL structure 106. In other words, the process for forming the RDL structure 106 can be used for forming the RDL structure 123. In some embodiments, the RDL structure 123 includes one or more through via structures 127 disposed in the IMD layer 125. The through via structure 127 is electrically coupled between the corresponding first antenna element 140a and the RDL structure 123. In such cases, one or more through via structures 113 are formed in the molding compound layer 110. The through via structures 113 are electrically coupled to the RDL structure 106, and the through via structure 127 formed in the RDL structure 123 is electrically coupled between the corresponding first antenna element 140a and the corresponding through via structure 113. Similarly, the method and material used for forming the through via structure 113 and the through via structure 127 may be the same as or similar to those of the through via structures 112.

In some embodiments, the molding compound layer 128 is adhered to the RDL structure 123 via an optional dielectric layer 131 (or an adhesion layer). In some embodiments, the dielectric layer 131 is made of polyimide, silicon nitride, silicon oxynitride, or other suitable organic materials.

According to the foregoing embodiments, the semiconductor package structure is designed to fabricate patch antennas integrated into the semiconductor package structure. In the semiconductor package structure, it allows that the patch antennas partially overlap the underlying semiconductor die by the use of a shielding layer (i.e., the ground layer) between the top antenna element of each patch antenna and the semiconductor die. As a result, the size of the semiconductor package structure can be reduced, so as to reduce the manufacturing cost of the semiconductor package.

Moreover, the use of the ground layer between the top antenna element of each patch antenna and the semiconductor die can reduce the thickness of the RDL structure formed on the active surface of the semiconductor die. As a result, the form factor of the semiconductor package structure can be reduced, so as to reduce the size of the semiconductor package structure further. Also, flexible design for metal density in the fan-out structure (i.e., the RDL structure) and increased package warpage control can be obtained.

Additionally, since the sidewalls of the semiconductor die can be shielded by the use of dummy metal through via structures or a metal dam, antenna efficiency can be improved. Similarly, since the top antenna elements of the patch antennas can be isolated by the use of the metal isolating layer that is electrically coupled to the ground layer, antenna efficiency can be improved further.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a semiconductor die;
   a first redistribution layer (RDL) structure formed on a non-active surface of the semiconductor die;
   a ground layer formed in the first RDL structure;
   a second RDL structure formed on the first RDL structure;
   a first molding compound layer formed on the second RDL structure; and
   a first antenna, comprising:
   a first antenna element formed in the second RDL structure; and
   a second antenna element formed on the first molding compound layer,
   wherein each of the first antenna element and the second antenna element has a first portion overlapping the semiconductor die as viewed from a top-view perspective.

2. The semiconductor package structure as claimed in claim 1, wherein the first molding compound layer includes a curable polymer.

3. The semiconductor package structure as claimed in claim 1, further comprising:
   a third RDL structure formed on and electrically coupled to an active surface of the semiconductor die;
   a second molding compound layer surrounding the semiconductor die; and
   a second antenna formed in the second molding compound layer and electrically coupled to the second RDL structure.

4. The semiconductor package structure as claimed in claim 3, further comprising:
   a first through via structure formed in the second molding compound layer and electrically coupled between the ground layer and the third RDL structure;
   a second through via structure formed in the second molding compound layer and electrically coupled to the third RDL structure; and
   a third through via structure formed in the second RDL structure and electrically coupled between the first antenna element and the second through via structure.

5. The semiconductor package structure as claimed in claim 3, wherein the first antenna is a patch antenna and the second antenna is a dipole antenna.

6. The semiconductor package structure as claimed in claim 3, further comprising a plurality of conductive structures electrically coupled to the semiconductor die via the third RDL structure.

7. The semiconductor package structure as claimed in claim 3, wherein the first antenna element has a second portion adjoining the first portion, and wherein the ground layer has a plurality of through-openings respectively overlapping the second portion of the first antenna element as viewed from a top-view perspective.

8. The semiconductor package structure as claimed in claim 1, wherein the second RDL structure comprises an inter-metal dielectric (IMD) layer and conductive traces formed in the IMD layer.

9. The semiconductor package structure as claimed in claim 8, wherein the IMD layer is a single layer or a multi-layer structure.

10. The semiconductor package structure as claimed in claim 9, wherein the IMD layer includes one or more through via structures.

11. The semiconductor package structure as claimed in claim 10, wherein a first through via structure of the one or more through via structures electrically couples the first antenna element and the first RDL structure.

12. The semiconductor package structure as claimed in claim 1, further comprising a dielectric layer or adhesion layer between the first molding compound layer and the second RDL structure.

13. The semiconductor package structure as claimed in claim 12, comprising the dielectric layer between the first molding compound layer and the second RDL structure, wherein the dielectric layer includes polyimide, silicon nitride or silicon oxynitride.

* * * * *